(12) United States Patent
Vos

(10) Patent No.: US 8,437,386 B2
(45) Date of Patent: *May 7, 2013

(54) COMMUNICATION SYSTEM

(75) Inventor: Koen Vos, San Francisco, CA (US)

(73) Assignee: Skype, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 13/366,990

(22) Filed: Feb. 6, 2012

(65) Prior Publication Data

US 2012/0136656 A1    May 31, 2012

Related U.S. Application Data

(63) Continuation of application No. 12/005,164, filed on Dec. 21, 2007, now Pat. No. 8,194,725.

(30) Foreign Application Priority Data

Mar. 12, 2007  (GB) .................................. 0704732.7

(51) Int. Cl.
*H03H 7/40* (2006.01)

(52) U.S. Cl.
USPC ........... 375/232; 375/254; 375/296; 375/346; 375/348; 375/350

(58) Field of Classification Search .................. 375/232, 375/254, 296, 346, 348, 350
See application file for complete search history.

(56) References Cited

U.S. PATENT DOCUMENTS

| 3,967,102 A | 6/1976 | McCown |
| 4,185,168 A | 1/1980 | Graupe et al. |
| 5,717,824 A | 2/1998 | Chhatwal |
| 6,011,397 A | 1/2000 | Yasuda |
| 8,194,725 B2 | 6/2012 | Vos |
| 2005/0091040 A1 | 4/2005 | Nam et al. |
| 2006/0291597 A1 | 12/2006 | Take |
| 2008/0227396 A1 | 9/2008 | Vos |

FOREIGN PATENT DOCUMENTS

| JP | 04500558 | 1/1992 |
| JP | 7023256 | 1/1995 |
| JP | 8088783 | 4/1996 |
| JP | 8213943 | 8/1996 |
| WO | WO 2005/009019 A2 | 1/2005 |

OTHER PUBLICATIONS

Notice of Allowance, U.S. Appl. No. 12/005,164, dated Feb. 9, 2012.
Chicharo, J., et al., "Tunable /Adaptive Second-Order IIR Notch Filter," *International Journal of Electronics*, 68(5): 779-792 (1990).

(Continued)

*Primary Examiner* — Kabir A Timory
(74) *Attorney, Agent, or Firm* — Wolfe-SBMC

(57) ABSTRACT

A method for reducing ringing in a signal output from a filter comprising inputting a signal into a filter; filtering a first portion of the input signal to generate a filtered portion of the output signal; analyzing the filtered portion of the output signal; detecting if ringing is present in the filtered portion of the output signal based on said analysis; and adjusting the filter characteristics to reduce ringing in a subsequent filtered portion of the output signal if it is determined that ringing is present.

20 Claims, 9 Drawing Sheets

OTHER PUBLICATIONS

Nishimura, S., "An Improved Adaptive Notch Filter for Detection of Multiple Sinusoids," IEICE Transactions on Fundamentals of Electronics, Communications and Computer Sciences, Engineering Sciences Society, E77-A(6): 950-955 (1994).

International Search Report for PCT/IB2007/004442, dated Sep. 19, 2008.

Office Action, U.S. Appl. No. 12/005,164, dated May 23, 2011.

Final Office Action, U.S. Appl. No. 12/005,164, dated Oct. 31, 2011.

"Advisory Action", U.S. Appl. No. 12/005,164, (Jan. 6, 2012), 3 pages.

"Notice of Allowance", U.S. Appl. No. 12/005,164, (Feb. 9, 2012), 10 pages.

"Foreign Office Action", Japanese Application No. 2009-553225, (May 8, 2012), 2 pages.

"International Written Opinion", PCT Application No. PCT/IB2007/004442, (Sep. 24, 2009), 7 pages.

Prior Art

Prior Art

COMMUNICATION SYSTEM

RELATED APPLICATION

This application is a continuation of U.S. application Ser. No. 12/005,164, filed Dec. 21, 2007 now U.S. Pat. No. 8,194,725, which claims priority under 35 U.S.C. §119 or 365 to Great Britain Application No. 0704732.7, filed Mar. 12, 2007. The entire teachings of the above applications are incorporated herein by reference.

TECHNICAL FIELD

The present invention relates to signal processing. More particularly the present invention relates to a method and apparatus for removing ringing in a signal.

BACKGROUND

In a communication system a communication network is provided, which can link together two communication terminals so that the terminals can send information to each other in a call or other communication event. Information may include speech, text, images or video.

Modern communication systems are based on the transmission of digital signals. Analogue information such as speech is input from a microphone into an analogue to digital converter at the transmitter of one terminal and converted into a digital signal. The digital signal is then encoded and placed in data packets for transmission over a channel to the receiver of a destination terminal. When the digital signal is received at the destination terminal, the signal is decoded before it is input into a digital to analogue converter. The digital to analogue converter outputs an analogue signal to a loudspeaker or other output interface.

Analogue signals are often contaminated by electromagnetic interference from the power grid. In microphone signals, for example, this is perceived as a steady "hum". Depending on geographical location, this hum consists of 50 or 60 Hertz signals plus harmonics, with energy typically concentrated in the lowest few harmonics. Removing these interfering harmonics can greatly improve the perceived quality of the microphone signal.

Traditional narrowband speech encoding algorithms encode signals within a frequency range of about 300-3400 Hz. By removing the signal information below 300 Hz, the lowest, and usually strongest, power grid harmonics are already filtered out, which significantly reduces the problem of power grid interference.

However recently there has been a demand for speech encoders that have improved quality and provide a natural sounding speech output. This has led to the development of wideband speech encoding methods such as AMR-WB (Adaptive Multi Rate-Wide Band) which encode frequencies from 50-7000 Hz. For wideband speech encoding methods, the lowest power grid harmonics fall within the coded frequency band. Consequently when employing encoding techniques that encode lower frequencies the perceived hum caused by the power grid harmonics is more severe.

Since the frequency of the power grid signal is very stable, most known methods employ notch filters which remove a fixed frequency band to provide a simple and effective method for removing these interfering signals. The width of the frequency band removed by the notch filter may otherwise be referred to as the width of the notch filter. For example a notch filter with a frequency response that removes a narrow frequency band is referred to as a narrow width notch filter.

FIG. 1 shows an implementation of a notch filter. The filter comprises single sample delay elements 10 and 12, gain elements 14 and 16 and mixer elements 18, 20, 22 and 24. A signal s(n) is input into the filter and a signal y(n) is output from the filter.

In the time domain, the relationship between the output signal y(n) and the input signal s(n) may be expressed as:

$$y(n)=s(n)-Bs(n-1)+s(n-2)+(B-A)y(n-1)-(1-A)y(n-2) \quad \text{Equation (1)}$$

Where A and B are the gain coefficients of gain elements 16 and 14 respectively.

A function referred to as the Z transform, commonly used in the field of signal processing, may be used to convert a discrete time domain signal into a frequency domain representation.

The Z transform of a time signal x(n) may be defined as:

$$X(z) = Z\{x(n)\} = \sum_{n=0}^{\infty} x(n)z^{-n} \quad \text{Equation (2)}$$

Where z is a complex number:

$$z=Ke^{j\phi} \quad \text{Equation (3)}$$

where K is the magnitude of z, and $\phi$ is the angular frequency.

The Z transform Y(z) of the time domain output signal y(n) and the Z transform S(z) of the input signal s(n) may be used to show the transfer function H(z) of the filter:

$$H(z) = \frac{Y(z)}{S(z)} = \frac{1 - Bz^{-1} + z^{-2}}{1 - (B - A)z^{-1} + (1 - A)z^{-2}} \quad \text{Equation (4)}$$

FIG. 2 shows the frequency response of the notch filter shown in FIG. 1. In particular FIG. 2 shows the frequency response of the filter in the lowest part of the spectrum, from 0 Hz to 100 Hz. As shown, the region R in the graph referred to hereinafter as the notch region represents the frequencies that are removed by the notch filter. The width of the notch region corresponds to the width of the frequency band removed by the notch filter, and hence the width of the notch filter.

The gain coefficient A determines the width of the notch region and the gain coefficient B determines the frequency at the centre of the notch region, hereinafter referred to as the centre frequency $F_c$. Thus, the width of the notch filter may be set by selecting the value of the gain coefficient A of the first gain element 16. Similarly, the centre value of the frequency removed by the notch filter may be set by selecting the value of the gain coefficient B of the second gain element 14.

More specifically the notch width at −3 dB is related to the coefficient A by:

$$W_{3dB} \approx 0.16 F_S A \quad \text{Equation (5)}$$

where $W_{3dB}$ is the notch width in Hertz (Hz), between the two slopes of the notch region R at −3 dB, and $F_S$ is the sampling frequency in Hz. It can therefore be seen that, for a narrow notch filter, the coefficient A is made to be slightly larger than zero.

The notch centre frequency is related to the coefficient B by:

$$F_C \approx 0.16 F_S \arccos(B/2) \quad \text{Equation (6)}$$

where $F_C$ is the centre frequency in Hz, $F_S$ is the sampling frequency in Hz, and arccos is an arc cosine mapping. Setting the coefficient B of the second gain element 14 to a value slightly lower than 2 the notch filter can be configured to have a centre frequency $F_C$ of 50 Hz.

To avoid removing significant parts of the desired signal, the width of such notch filters must be very narrow. Using the coefficients;
A=0.001
B=1.9996137
the notch filter can is configured to have a notch centred at 50 Hz and with a width $W_{3dB}$ of 2.6 Hz, for a sampling frequency $F_S$ of 16 kHz.

However the use of narrow notch filters leads to an undesired phenomenon known as ringing. Ringing is an exponentially damped sinusoidal response of a filter to an impulse. For example, if the input signal is speech, the notch filter may occasionally be excited by harmonics of the speech signal matching the notch frequency. After the burst of speech, the notch filter will continue to produce a damped sinusoid at the notch frequency for perhaps a few seconds, depending on the notch width. This ringing gives an undesired reverberation-like quality to the sound. The ringing time of a notch filter increases in inverse proportion to the notch width in frequency. Therefore, for narrow filters the ringing time is particularly pronounced.

The time response of the notch filter shown in FIG. 1 is depicted in FIG. 3, which shows significant ringing for about half a second. FIG. 3 assumes a nonzero filter state, that is, the time delay elements 10 and 12 of the filter have a residual energy caused by a previous nonzero input. A similar time response would be achieved in response to an impulse input into a filter having a zero filter state, having no residual energy from a previous input. This is known as the impulse response of the filter.

A notch filter that is sufficiently narrow not to remove audible portions of the signal will introduce audible ringing in the signal. Conversely if the width of the notch filter is designed to be wide enough not to cause ringing in the signal the filter will audibly remove parts of the input speech signal.

An alternative method for removing steady sinusoidal components from an input signal employs adaptive cancellation, see e.g., H.C.So, "Adaptive Algorithm for Sinusoidal Interference Cancellation," Electronics Letters, vol. 33, no 0.22, pp 0.1910-1912, October 1997. Adaptive cancellation works in three steps. First, the parameters of one or more interfering sinusoids are adaptively estimated. Then sinusoids are synthesized based on those parameters. Finally, the synthesized sinusoids are subtracted from the input signal to create the hum-removed signal. In case of power grid harmonics, the frequency parameters are known and essentially constant, so that only the amplitude and phase parameters need to be estimated. These parameters can be estimated adaptively using any well-known adaptation method such as the Least Mean Squares (LMS) algorithm.

Adaptive cancellation suffers from very much the same problems as notch filtering, in that a trade off is made between ringing and distortions of the desired component of the input signal. Distortions may result if the parameter estimation adapts too quickly, whereas ringing may occur when the parameter estimation adapts too slowly.

It is therefore an aim of the present invention to overcome the problems presented by the prior art.

SUMMARY

According to a first aspect of the present invention there is provided a method for reducing ringing in a signal output from a filter comprising: inputting a signal into a filter; filtering a first portion of the input signal to generate a filtered portion of the output signal; analyzing the filtered portion of the output signal; detecting if ringing is present in the filtered portion of the output signal based on said analysis; and adjusting the filter characteristics to reduce ringing in a subsequent filtered portion of the output signal if it is determined that ringing is present.

According to a second aspect of the present invention there is provided a device arranged to reduce ringing in an output signal comprising: a receiver arranged to receive an input signal; a filter arranged to filter a first portion of the input signal to generate a filtered portion of the output signal; and a controller arranged to analyze the filtered portion of the output signal; detect if ringing is present in the filtered portion of the output signal based on said analysis; and adjust the filter characteristics to reduce ringing in a subsequent filtered portion of the output signal if it is determined that ringing is present.

One advantage of dynamically adjusting the notch filter impulse response in accordance with embodiments of the present invention is that it allows for the use of notch filters to effectively remove an undesired signal component of steady frequency, such as a power grid harmonic, without causing the removal of substantial parts of the signal while effectively preventing ringing in the output signal.

BRIEF DESCRIPTION OF THE DRAWINGS

For a better understanding of the present invention and to show how the same may be carried into effect, embodiments of the present invention will now be described with reference to the following drawings.

DETAILED DESCRIPTION

The inventor of the present invention has found that the problems presented in the prior art may be overcome by adjusting the impulse response of a notch filter in accordance with the characteristics of the signal output from the filter. More specifically, the impulse response of the notch filter may be dynamically adjusted to reduce ringing when ringing is detected on the signal output from the filter. By adjusting the impulse response of the notch filter to reduce ringing when ringing is present on the output signal, significantly reduces the audibility of ringing in the output signal without removing significant parts of the signal when no ringing is present.

In accordance with an embodiment of the invention damping may be applied to the impulse response of the filter when ringing is detected. This may be achieved by adjusting the frequency response of the filter in dependence on detecting ringing in the output signal.

According to one embodiment of the invention the frequency response of the filter may be adjusted such that the width of the notch region is increased during ringing, thereby damping the impulse response of the notch filter and reducing ringing. Alternatively, or additionally the frequency response of the filter may be adjusted such that the depth of the notch region is decreased during ringing, thereby damping the impulse response of the notch filter and reducing ringing.

By increasing the width of the notch region and decreasing the depth of the notch region the output signal is made to follow the input signal more closely, thus damping the impulse response of the notch filter.

Figure 4:
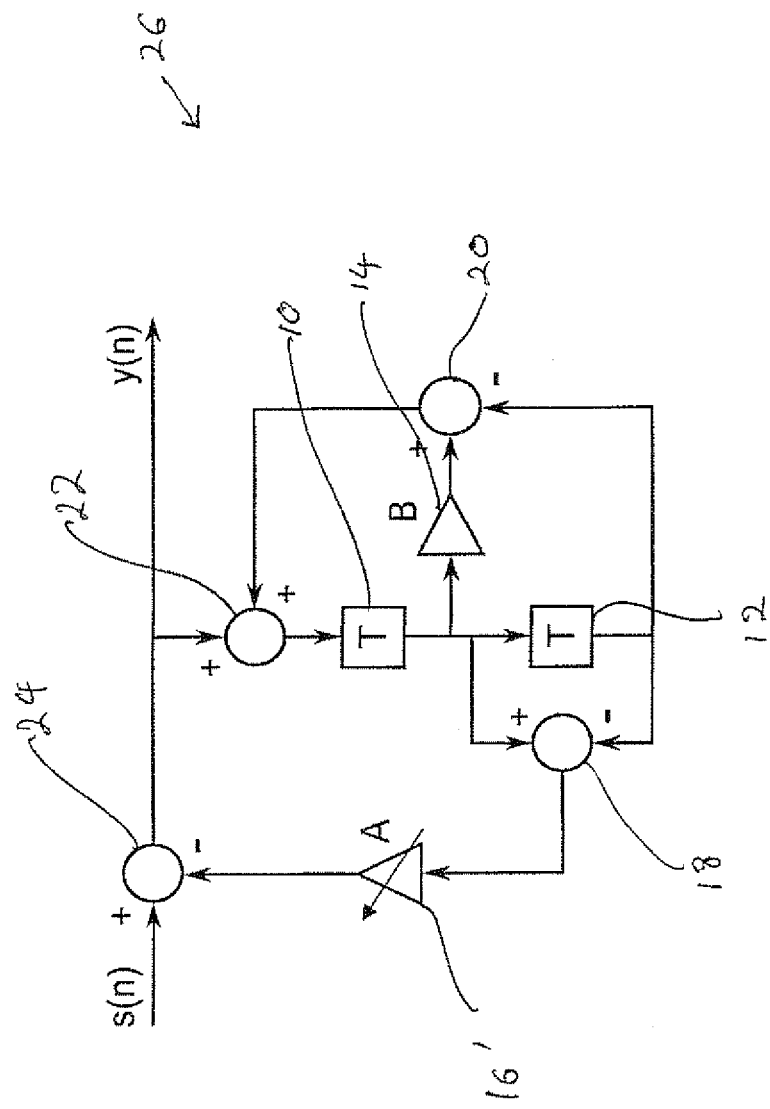
FIG. 4 shows an adjustable notch filter in accordance with an embodiment of the present invention.

The manner in which an embodiment of the present invention may be implemented will first be described with reference to FIG. 4. FIG. 4 shows an adjustable notch filter 26 having an adjustable notch width. The components that are described in relation to the fixed notch filter shown in FIG. 1 are referred to in FIG. 4 using like reference numerals.

Figure 1:
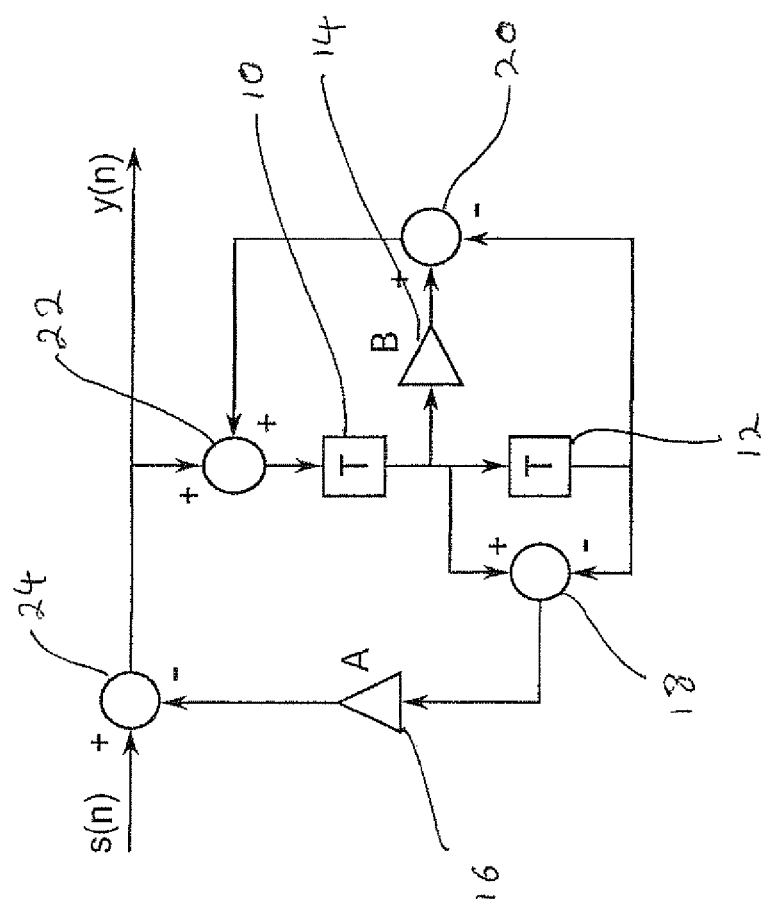
FIG. 1 shows a notch filter in accordance with the prior art.

In FIG. 4 the first gain element 16 shown in FIG. 1 is replaced by an adjustable gain element 16'. The width of the notch filter 26 may be adjusted by adjusting the gain coefficient A of the adjustable gain element 16'. The mixer element 24 is arranged to subtract the output of the adjustable gain element 16' from the input signal s(n). By increasing the coefficient A, the width of the frequency band applied to the mixer element 24 is increased. According to an embodiment of the invention the gain coefficient A is adjusted to increase the width of the notch filter when ringing is detected on the output signal y(n). Increasing the width of the notch filter dampens the impulse response of the filter 26, thus reducing the ringing time.

Figure 5:
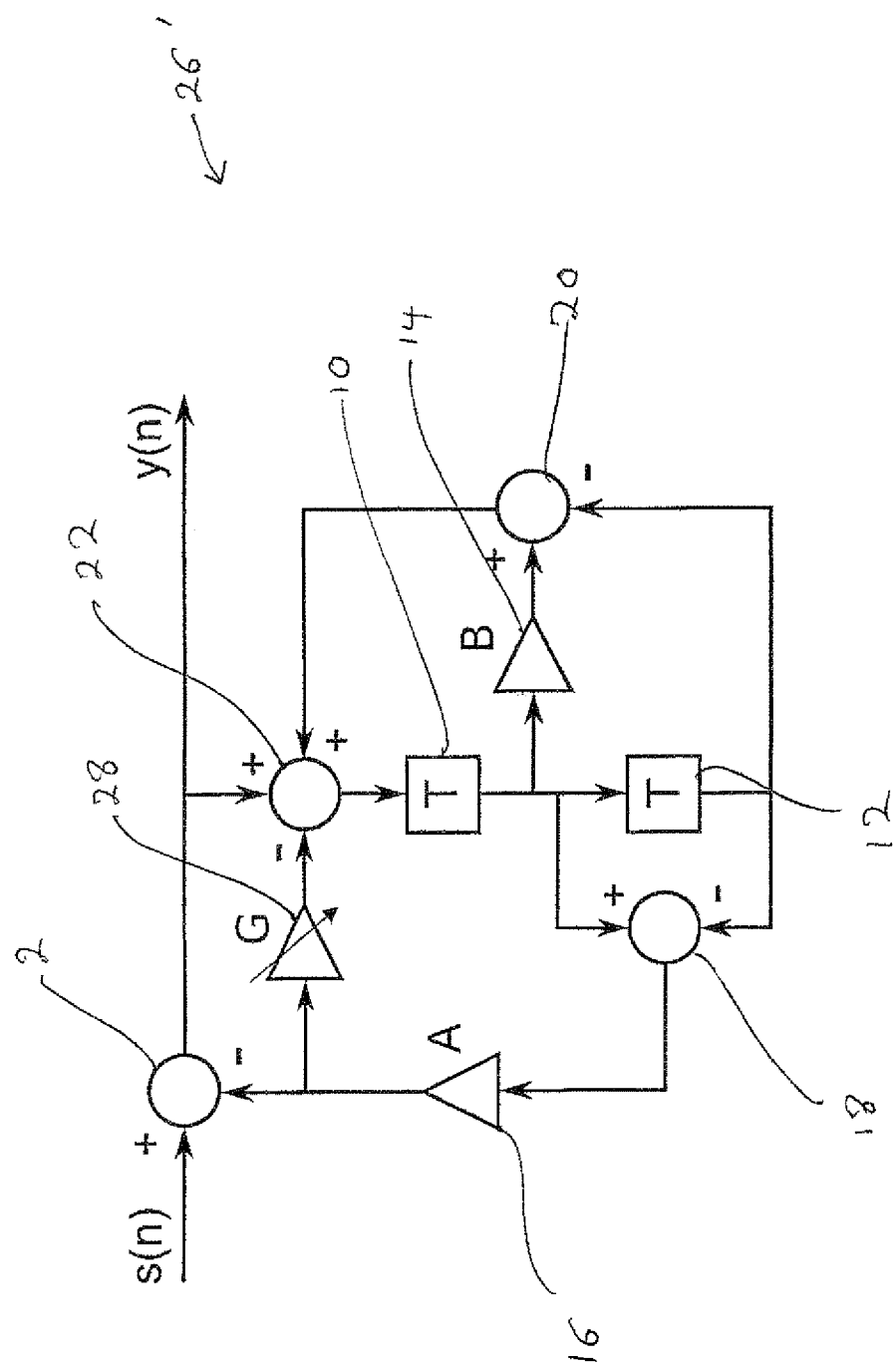
FIG. 5 shows an adjustable notch filter in accordance with an further embodiment of the present invention.

Increasing the coefficient A to reduce ringing in the output signal y(n) may however cause artifacts in the signal output from the adjustable gain element 16'. In a preferred embodiment of the invention an adjustable notch filter as shown in FIG. 5 is used to filter the signal. The adjustable notch filter 26' as shown in FIG. 5 is adjustable in notch width and depth, and is arranged to produce less artifacts than the filter shown in FIG. 4. It will be appreciated by a person skilled in the art that different possible filter arrangements will produce different artifacts in response to changing filter coefficients.

The components that are described in relation to the fixed notch filter shown in FIG. 1 are referred to in FIG. 5 using like reference numerals. In addition to the components included in the fixed notch filter described in relation to FIG. 1 the adjustable notch filter 26' also includes a third gain element 28 which applies a gain G. The third gain element 28 is adjustable.

As shown in FIG. 5 the first mixer element 22 adds together the output signal y(n) with the output of the second mixer 20 and subtracts from this the output of the third gain element 28 to provide an output to the first single sample delay element 10. The delay element 10 introduces a delay to the signal output from the first mixer 22 before outputting the signal to the first gain element 14, the second delay element 12 and the third mixer 18. The first gain element applies a gain B to the signal received from the delay element 10.

The second mixer 20 subtracts the output of the second delay element 12 from the output of the first gain element and outputs the resulting signal to the first mixer element 22.

The third mixer 18 subtracts the output of the second delay element 12 from the output of the first delay element 10 and outputs the resulting signal to the second gain element 16 where a gain A is applied. The output of the second gain element 16 is applied to the fourth mixer 24 where it is subtracted from the input signal s(n). The output of the second gain element 16 is also input into the third gain element 28 where a gain G is applied to the signal.

For the filter shown in FIG. 5, the relationship between the input signal s(n) and the output signal y(n) can be expressed as:

$$y(n)=s(n)-(B-GA)s(n-1)+(1-GA)s(n-2)+(B-(G+1)A)y(n-1)-(1-(G+1)A)y(n-2) \quad \text{Equation (7)}$$

Using the z transform S(z) of the input signal and the z transform of the output signal Y(z) the adjustable notch filter shown in FIG. 5 can be shown to have a transfer function:

$$H(z) = \frac{Y(z)}{S(z)} = \frac{1-(B-GA)z^{-1}+(1-GA)z^{-2}}{1-(B-(G+1)A)z^{-1}+(1-(G+1)A)z^{-2}} \quad \text{Equation (8)}$$

Where A is the gain coefficient of the second gain element 16, B is the gain coefficient of the first gain element 14 and G is an adjustable gain coefficient of the third gain element 28.

If the gain coefficient G of the third gain element 28 is made equal to zero, then the frequency response of the adjustable notch filter shown in FIG. 5 will be the same as the frequency response of the notch filter shown in FIG. 1. However, by making the gain coefficient G larger than zero, without changing the values of the gain coefficients A and B the frequency response of the filter changes such that the width of the notch filter increases and the notch becomes shallower. As a result the impulse response of the filter is dampened.

Figure 2:
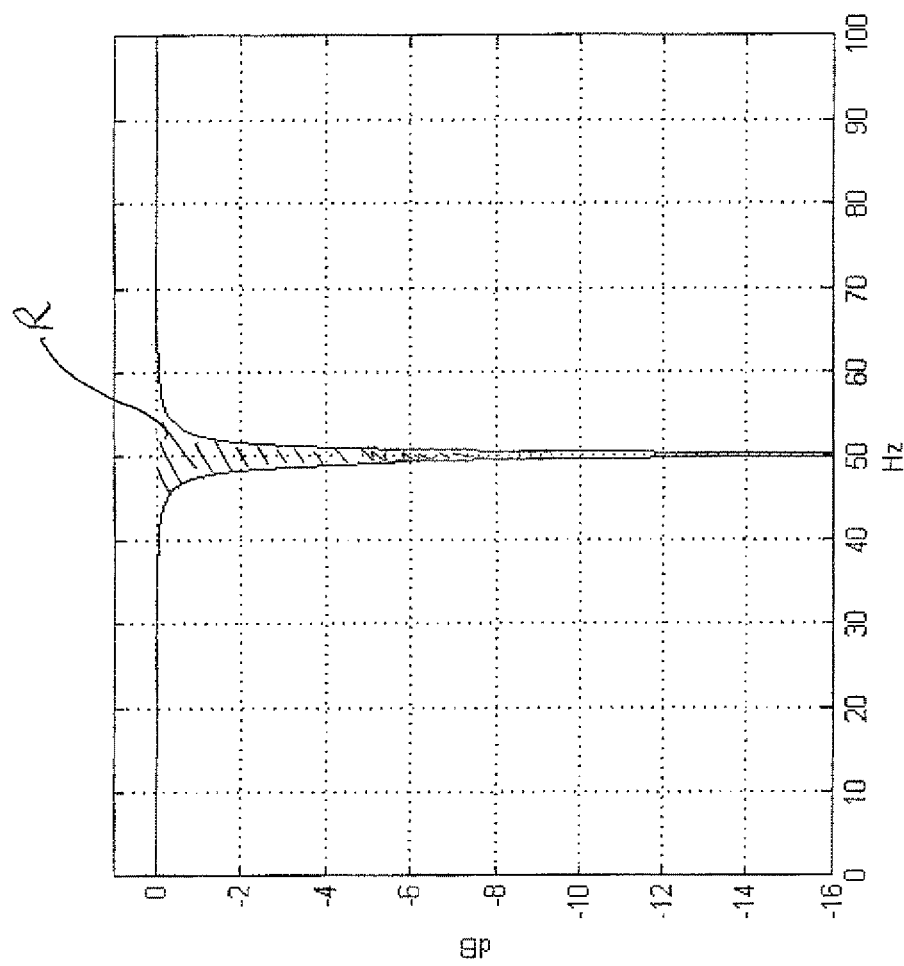
FIG. 2 shows the frequency response of the notch filter shown in FIG. 1.
Figure 6:
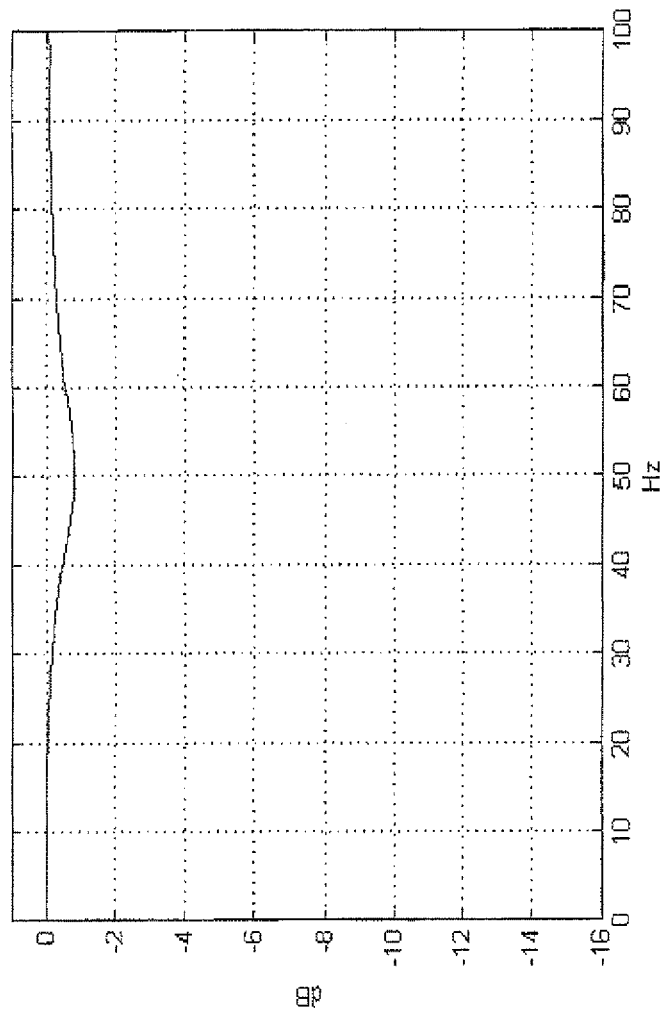
FIG. 6 is a graph showing a damped frequency response of a notch filter in accordance with an embodiment of the present invention.

FIG. 6 shows a graph of the frequency response of the adjustable filter shown in FIG. 5 when G=10. When the graph shown in FIG. 6 is compared to the frequency response graph shown in FIG. 2 it can be seen that the notch region R shown in FIG. 5 is wider and shallower than the notch region shown in FIG. 2.

Figure 3:
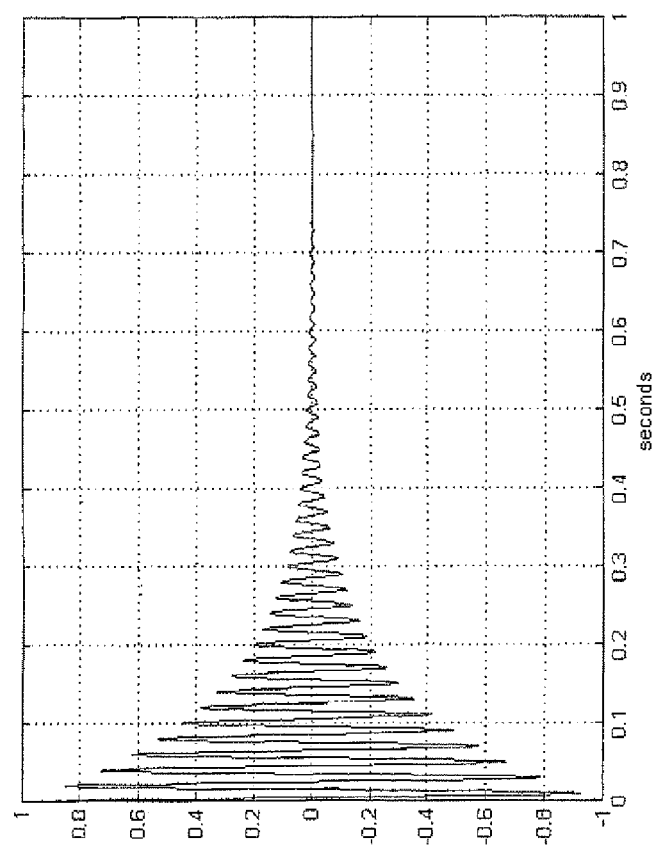
FIG. 3 shows the time response of the notch filter shown in FIG. 1.
Figure 7:
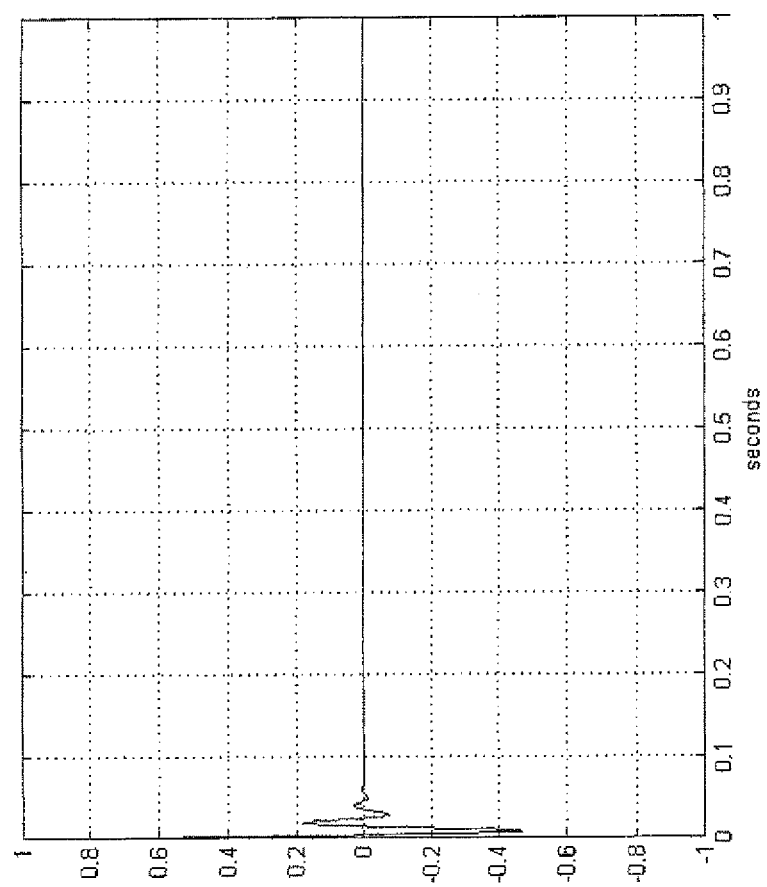
FIG. 7 is a graph showing a damped time response of a notch filter in accordance with an embodiment of the present invention.

FIG. 7 shows a graph of the time response of the adjustable filter shown in FIG. 5 when the coefficient G is made equal to 10. Comparing the time response shown in FIG. 7 to the time response shown in FIG. 3 it can be seen that the ringing time as shown in FIG. 7 is significantly reduced, in this case to approximately 50 milliseconds.

In one embodiment of the invention when no ringing is present in the output signal the adjustable notch filter is used such that G is set to 0, and the notch filter will remove any steady tonal component at the frequency to which it is tuned. Only when ringing is present will the adjustable coefficient G be increased to dampen the notch filter so that the ringing will die out quickly, after which G is returned to 0.

The inventor of the present invention has identified that during ringing, at some instances the output energy will be larger than the input energy. Accordingly, the inventor of the present invention has found that ringing in the output signal may be detected if the magnitude of the output energy is determined to be greater than the input energy at a given instance.

According to a preferred embodiment of the invention, ringing in the output signal y(n) may be detected by detecting that the magnitude of the energy of the output signal is greater than the magnitude of the energy of the input signal.

Figure 8:
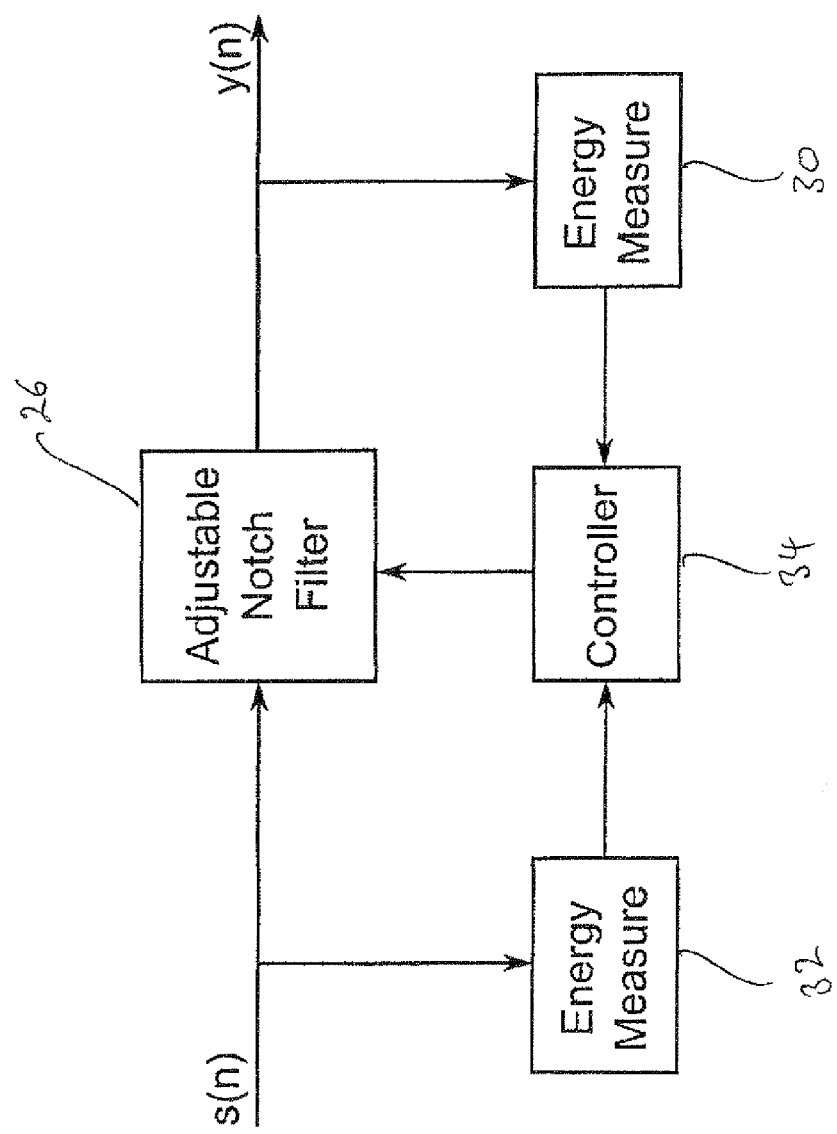
FIG. 8 shows a circuit for controlling the adjustable notch filter in accordance with an embodiment of the present invention.

FIG. 8 shows a circuit for controlling the adjustable notch filter 26 in accordance with an embodiment of the present invention. The control circuit shown in FIG. 8 includes the adjustable notch filter 26, a controller block 34, an input energy measure block 32 and an output energy measure block 30.

The adjustable notch filter is arranged to receive an input signal s(n) and to output a signal y(n). The input signal s(n) is also input into the input energy measure block 32. The output signal is input into the output energy measure block 30. The controller block 34 receives an input from the input energy measure block 32 and the output energy measure block 30. The adjustable notch filter 26 receives a control signal from the controller block 34.

The input and output signals may be regarded as comprising a series of frames, each frame containing an equal portion of the signal. For example each frame may have a frame length of 10 milliseconds. In operation the input energy measure block 32 determines the energy for each frame of the input signal. In the same manner, the output energy measure block 34 determines the energy for each frame of the output signal y(n). The energy determined for each frame of the input signal and the output signal is reported to the controller block 34.

The controller block 34 is arranged to compare the energy determined for the input signal s(n) and the energy determined for the output signal y(n) for each frame. When the magnitude of the energy of a frame of the output signal exceeds the magnitude of the energy of a frame of the input signal, the controller is arranged to output a control signal to the adjustable notch filter 26 to dampen the time response of the filter 26. In a preferred embodiment of the invention the time response of the filter 26 is damped by increasing the width of the notch filter and decreasing the depth of the notch region. When employing the adjustable notch filter described with reference to FIG. 5, this may be achieved by increasing the gain coefficient G of the third gain block 28 from 0 to 10. The other coefficients A and B are kept unchanged.

As soon as the magnitude of the energy of a subsequent frame of the output signal y(n) is less than the magnitude of the energy of the input signal s(n), the G parameter is reset to 0, thus narrowing the notch of the filter 26.

Figure 9:
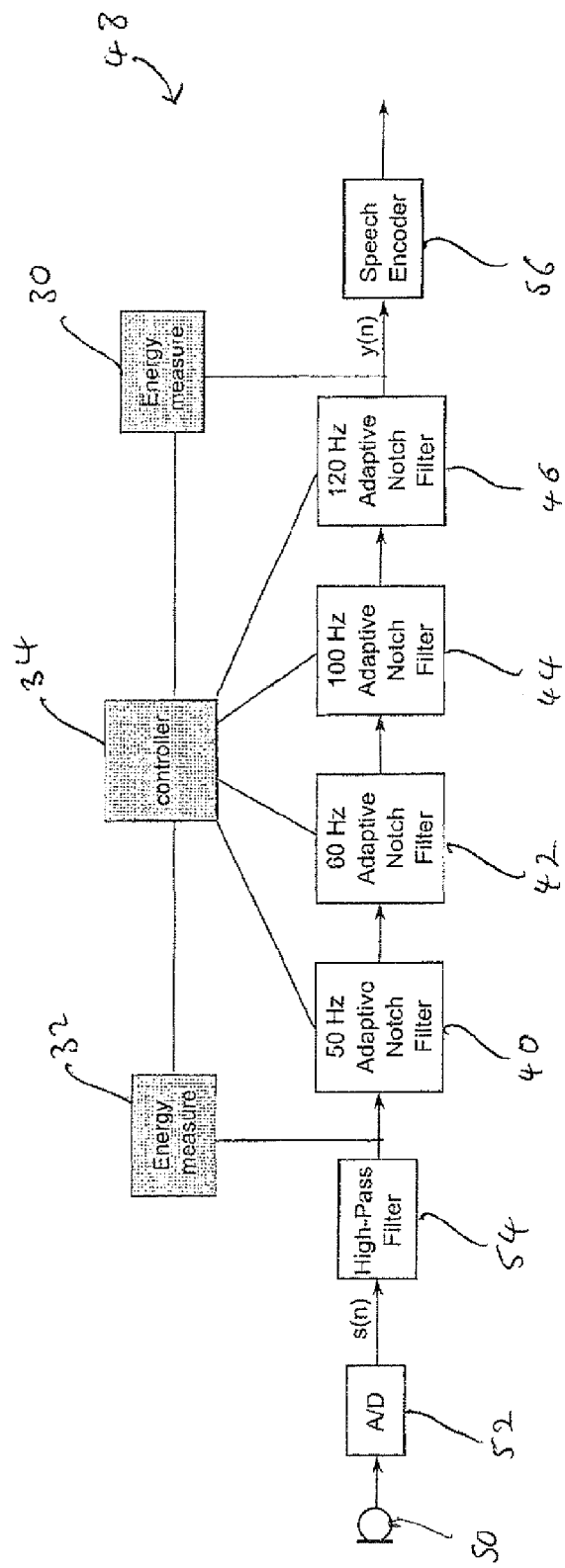
FIG. 9 which shows a series of adjustable filters used to remove multiple harmonics, in accordance with an embodiment of the present invention.

Reference is now made FIG. 9 which shows the transmitting circuitry 48 of a terminal in accordance with an embodiment of the invention. In order to remove multiple harmonics, the input signal s(n) is processed through a series of adjustable notch filters, each tuned to a different harmonic frequency.

The transmitting circuitry 48 includes a series of adjustable filters used to remove multiple harmonics. As shown in FIG. 9, four adjustable notch filters 40, 42, 44 and 46 are provided having a notch tuned to 50 Hz, 60 Hz, 100 Hz and 120 Hz respectively. More or fewer adjustable notch filters can be used to remove more or fewer harmonics.

The transmitting circuitry also includes a microphone 50, an analogue to digital converter 52, a high pass filter 54, a speech encoder 56, an input energy measure block 32, an output energy measure block 30 and a controller 34.

The microphone is arranged to receive an input signal to be transmitted to a destination terminal via a communication network. The input signal may comprise speech input by a user of the terminal. The microphone outputs the analogue input signal to the analogue to digital converter 52. The analogue to digital converter converts the analogue input signal to a digital input signal s(n). The digital input signal is then input into a high pass filter 54 which removes the low frequencies from the input signal s(n).

The high pass filter outputs the signal s(n) to the series of adjustable notch filters. The signal s(n) is also input into the input energy measure block 32. The signal y(n) output from the series of adjustable notch filters is input into an encoder 56 that is used to encode the signal y(n) before transmitting the signal. The signal y(n) is also output from the series of adjustable notch filters to the output energy measure block 30.

The input energy measure block 32 and the output energy measure block 30 report the magnitude of the energy of the input and output signals respectively to the controller block as described in relation to FIG. 8. If the controller block determines that the magnitude of the energy of a frame of the output signal exceeds the magnitude of the energy of a frame of the input signal, the controller is arranged to output a control signal to each adjustable notch filter to dampen the impulse response of each filter.

As soon as the magnitude of the energy of a subsequent frame of the output signal y(n) is less than the magnitude of the energy of the input signal s(n), the damping applied to the impulse response of the filter is removed.

According to an alternative embodiment of the invention, a separate control block may be used to control the width of each adjustable notch filter provided in the transmitting circuitry. According to this embodiment of the invention an input energy measure block and an output energy measure block are provided for each filter to measure the energy of the input signal and the output signal of each filter. The width of each filter is then controlled independently of the other filters in the series.

According to a further alternative embodiment of the invention the impulse response of the filter may be damped by reducing the depth of notch region of the adjustable notch filter, without necessarily increasing the width of the filter. For the filter shown in FIG. 5, the depth of the notch region of the filter may be varied independently of the width of the notch region by adjusting the gain coefficient A of the gain element 16 to effectively cancel notch width variations caused by changing the gain coefficient of the gain element 28.

The above described embodiments may be implemented as hardware in a terminal or as software running on a processor in a terminal. The software for providing the operation may be stored on and provided by means of a carrier medium such as a carrier disc, card or tape. A possibility is to download the software via a data network. This is an implementation issue.

While this invention has been particularly shown and described with reference to preferred embodiments, it will be understood to those skilled in the art that various changes in form and detail may be made without departing from the scope of the invention as defined by the claims.

What is claimed is:

1. A method comprising:
  inputting a speech signal into a filter having filter characteristics effective to cause the filter to filter a first portion of the input speech signal to generate a filtered portion of an output signal;
  analyzing the filtered portion of the output signal by determining both an energy of a frame of the input speech signal and an energy of a frame of the filtered portion of the output signal;
  detecting if ringing is present in the filtered portion of the output signal based on said analysis; and
  adjusting the filter characteristics to reduce ringing in a subsequent filtered portion of the output signal if it is determined that ringing is present in the filtered portion by outputting a control signal to the filter effective to cause the filter to filter a subsequent portion of the speech signal to generate the subsequent filtered portion, the control signal configured to dampen an impulse response of the filter.

2. The method as claimed in claim 1 wherein adjusting the filter characteristics allows the output signal to follow the input speech signal.

3. The method as claimed in claim 1 wherein the first portion of the input speech signal is a frame of the input signal.

4. The method as claimed in claim 1 wherein the filtered portion of the output signal is a frame of the output signal.

5. The method as claimed in claim 1 wherein the filter is a notch filter.

6. The method as claimed in claim 5 wherein the filter characteristics are adjusted by increasing a width of the notch filter.

7. The method as claimed in claim 5 wherein the filter characteristics are adjusted by decreasing a depth of the notch filter.

8. The method as claimed in claim 5 wherein the notch filter includes at least one gain element.

9. The method as claimed in claim 8 wherein a width of the notch filter is increased by adjusting a gain coefficient of said at least one gain element.

10. The method as claimed in claim 8 wherein a depth of the notch filter is decreased by adjusting a gain coefficient of said at least one gain element.

11. The method as claimed in claim 1 further comprising:
analyzing the subsequent filtered portion of the output signal;
detecting if ringing is present in the subsequent filtered portion of the output signal based on said analyzing the subsequent filtered portion; and
adjusting the filtering characteristics with an equal and opposite adjustment to the adjustment that was made to reduce ringing if it is determined that ringing is not present.

12. The method as claimed in claim 1 wherein said detecting if ringing is present in the filtered portion of the output signal further comprises:
comparing the energy of the frame of the filtered portion of the output signal to the energy of the frame of the input speech signal; and
determining that ringing is present in the output signal if the energy of the frame of the filtered portion of the output signal is greater than the energy of the frame of the input signal.

13. A device comprising:
a receiver configured to receive a speech signal;
a filter, having filter characteristics, configured to filter a first portion of the speech signal to generate a filtered portion of an output signal;
a controller configured to:
analyze the filtered portion of the output signal by determining both an energy of a frame of the speech signal and an energy of a frame of the filtered portion of the output signal;
detect if ringing is present in the filtered portion of the output signal based on said analysis; and
adjust the filter characteristics to reduce ringing in a subsequent filtered portion of the output signal if it is determined that ringing is present in the filtered portion by outputting a control signal to the filter effective to cause the filter to filter a subsequent portion of the speech signal to generate the subsequent filtered portion, the control signal configured to dampen an impulse response of the filter.

14. The device as claimed in claim 13, wherein the filter is configured to adjust the filter characteristics to enable the output signal to follow the speech signal.

15. The device as claimed in claim 13, wherein the first portion of the speech signal is a frame of the signal, and wherein the filtered portion of the output signal is a frame of the output signal.

16. The device as claimed in claim 13, wherein the filter is a notch filter, and wherein the controller is further configured to adjust the filter characteristics by increasing a width of the notch filter or by decreasing a depth of the notch filter.

17. A communications terminal comprising:
a receiver configured to receive a speech signal;
a filter, having filter characteristics, configured to filter a first portion of the speech signal to generate a filtered portion of an output signal;
a controller configured to:
analyze the filtered portion of the output signal by determining both an energy of a frame of the speech signal and an energy of a frame of the filtered portion of the output signal;
detect if ringing is present in the filtered portion of the output signal based on said analysis; and
adjust the filter characteristics to reduce ringing in a subsequent filtered portion of the output signal if it is determined that ringing is present in the filtered portion by outputting a control signal to the filter effective to cause the filter to filter a subsequent portion of the speech signal to generate the subsequent filtered portion, the control signal configured to dampen an impulse response of the filter.

18. The communications terminal as claimed in claim 17, wherein the filter is further configured to adjust the filter characteristics to enable the output signal to follow the speech signal.

19. The communications terminal as claimed in claim 17, wherein the first portion of the input speech signal is a frame of the input signal, and wherein the filtered portion of the output signal is a frame of the output signal.

20. The communications terminal as claimed in claim 17, wherein the filter is a notch filter, and wherein the controller is further configured to adjust the filter characteristics by increasing a width of the notch filter or by decreasing a depth of the notch filter.

* * * * *